United States Patent [19]

Murayama et al.

[11] Patent Number: 5,081,074
[45] Date of Patent: Jan. 14, 1992

[54] METHOD FOR PRODUCTION OF JOINT SINTERED ARTICLE OF HIGH-TEMPERATURE SUPERCONDUCTIVE CERAMICS AND JOINT SINTERED ARTICLE PRODUCED THEREBY

[75] Inventors: Norimitsu Murayama; Shuji Sakaguchi; Yasuharu Kodama, all of Nagoya, Japan

[73] Assignee: Agency of Industrial Science & Technology, Ministry of International Trade & Industry, Tokyo, Japan

[21] Appl. No.: 497,679

[22] Filed: Mar. 23, 1990

[30] Foreign Application Priority Data

Jun. 27, 1989 [JP] Japan .................................. 1-164827

[51] Int. Cl.$^5$ .............................................. B32B 9/00
[52] U.S. Cl. ........................................ 505/1; 505/701; 505/702; 505/703; 505/704; 428/220; 428/409; 428/688; 428/930
[58] Field of Search ...................... 505/1, 701-704; 428/220, 409, 688, 930

[56] References Cited

U.S. PATENT DOCUMENTS 4,975,411  12/1990  Danby et al. .......................... 264/24
4,990,493  2/1991  Lay ...................................... 252/521

OTHER PUBLICATIONS

Becher et al, *Ceramic Bulletin*, vol. 58, p. 582 (1979).

Primary Examiner—Patrick J. Ryan
Attorney, Agent, or Firm—Oblon, Spivak, McClelland, Maier & Neustadt

[57] ABSTRACT

A joint sintered high-temperature superconductive ceramic article is obtained by joining two sintered high-temperature superconductive ceramic masses formed of oriented crystal grains in such a manner that the directions of grain-orientation are different across the interface of union and pressing the joined ceramic masses against each other perpendicularly to the interface of union and, at the same time, heating them.

4 Claims, 1 Drawing Sheet

METHOD FOR PRODUCTION OF JOINT SINTERED ARTICLE OF HIGH-TEMPERATURE SUPERCONDUCTIVE CERAMICS AND JOINT SINTERED ARTICLE PRODUCED THEREBY

BACKGROUND OF THE INVENTION

1. Field of the Invention

This invention relates to a method for the production of a joint sintered article of high-temperature superconductive ceramics having particles oriented in different directions (direction of grain-orientation) across the interface thereof and to a joint sintered article produced by the method.

The present invention is utilized effectively in the development of such superconductive devices as superconductive magnetic sensors, superconductive transistors, and superconductive switches, for example.

2. Prior Art Statement

Superconductors possess such unusual properties as zero resistance, Josephson effect, and perfect diamagnetism. Owing to these unique phenomena, they are expected to encourage development of gigantic superconductive power generators and ultra high-speed computers. Since high-temperature superconductive ceramics manifesting superconductivity at temperatures above the temperature of liquefied nitrogen were discovered recently, the industrial application of such high-temperature superconductive ceramics has been spreading rapidly in the fields of electric power, electronics, transportation, and medicine, for example.

Recently reported high-temperature oxide superconductors exhibit their superconductive properties anisotropically by reason of crystal structure. This fact has led to the idea of developing new high-temperature superconductive devices which make use of interfaces across which the directions of grain-orientation are different.

Use of single crystals is conceivable as a means for producing superconductors possessing an interface across which directions of grain-orientation are different. As things stand now, high-temperature oxide superconductors are extremely limited in their ability to allow growth of single crystal. When a single crystal is obtained somehow or other, it has an extremely small size (on the order of several microns) and is sparingly capable of forming a joint interface of the foregoing description. While a thin film of superconductor may be formed in the shape of a single crystal on a substrate, it is difficult to join such thin films in such a manner that the directions of grain-orientation differ across the interface.

In the circumstances, the industry requires a technique for joining two oriented high-temperature superconductive ceramic masses in such a manner that their directions of grain-orientation differ across their interface and, at the same time, allowing the junction to maintain the superconductive properties of its own intact.

SUMMARY OF THE INVENTION

The present inventors have continued a study with a view to developing a technique for attaining the union of ceramic masses in the manner described above. They have found as the result of this study that when two high-temperature superconductive ceramic masses are brought into mutual contact in such a manner that their grain orientations are different across their joint of contact and the joined ceramic masses are heated under application of pressure to determine their behaviors, these ceramic masses are strongly joined under specific conditions of temperature and pressure and the resultant product of union exhibits high-temperature superconductivity. The present invention has been perfected as the result. Specifically, the present invention is directed to a method for the production of a joint sintered article of high-temperature superconductive ceramic masses, which method essentially consists of causing the surface of a sintered mass of a high-temperature superconductive ceramic substance formed of crystal grains oriented to contact closely the surface of a sintered mass of a high-temperature superconductive ceramic substance formed of crystal grains oriented is a different direction in such a manner that the directions of orientation of the two ceramic masses are different across the interface of union and pressing the joined ceramic masses against each other in the longitudinal direction relative to the interface of close union under a pressure in the range of 10 to 100 kg/cm² and, at the same time, heating the joined ceramic masses at a temperature in the range of 600° C. to 950° C. and to a joint sintered article of high-temperature superconductive ceramic substance which are produced by the method described above.

The above and other features and objects of the invention will become apparent with the following detailed description made with reference to the attached drawings.

DETAILED DESCRIPTION OF THE PREFERRED EMBODIMENTS

Figure 1:
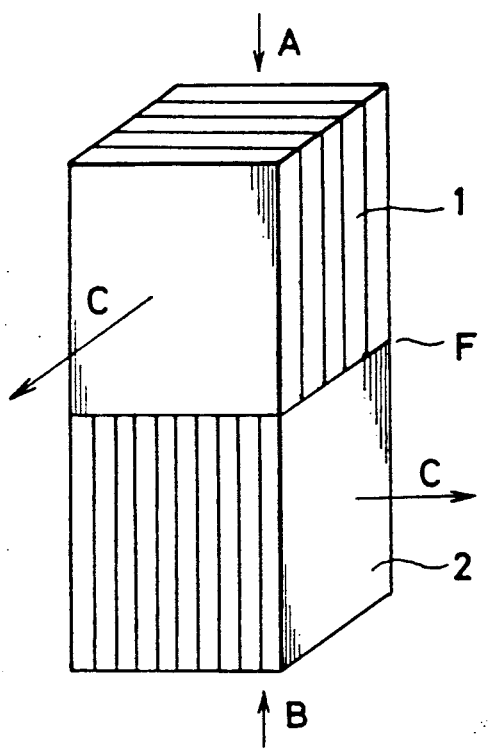
FIG. 1 is a diagram illustrating the structure of a joint in a sintered article obtained in Examples 1 and 2 and FIG. 2 a diagram illustrating the structure of a joint in a sintered article obtained in Example 3.

The methods which are available for the aforementioned heat treatment under application of pressure include the hot press method and the hot forge method, for example.

The high-temperature superconductive ceramic substance to which the method of the present invention is applied is not specifically defined. A ceramic substance possessing a composition represented by the general formula, $Bi_{2-v}Pb_vSr_wCa_xCu_yO_z$, providing that subscripts v, w, x, y, and z satisfy the following relations: $0.25 \leq v \leq 0.50$, $1.40 \leq w \leq 2.20$, $1.60 \leq x \leq 2.40$, $2.80 \leq y \leq 3.50$, and $9.00 \leq z \leq 11.0$ can be used advantageously, for example.

Though the two sintered ceramic masses to be joined are desired to possess one and the same composition, they may possess different compositions.

In accordance with the method of the present invention, the joined sintered ceramic masses are pressed against each other in the longitudinal direction relative to the interface of union with a pressure in the range of 10 to 100 kg/cm² while being heated at a temperature in the range of 600° C. to 950° C. Under the impact of heat and pressure thus applied, the two sintered ceramic masses are joined fast owing to the mutual diffusion of ions. The diffusion of ions either occurs only insufficiently or does not occur at all when the temperature and pressure are short of the respective lower limits of the specified ranges. If the temperature exceeds 950° C., there ensues a possibility of the sintered ceramic masses being deformed. If the pressure is unduly high, there arises a possibility of the sintered ceramic masses being fractured.

In the joint sintered high-temperature superconductive ceramic article, the joined component sintered ceramic masses adhere so strongly to each other that there is no possibility of the component ceramic masses being accidentally separated from each other.

For the sake of the union under discussion, the roughness of the opposed surfaces of the sintered ceramic masses plays an important role. To be specific, this surface roughness is desired to be not more than 1 $\mu$m. If the surface roughness exceeds this lower limit, the union occurs with insufficient fastness and the produced joint sintered article fails to acquire high-temperature superconductivity aimed at by this invention.

EXAMPLE

Production of sintered ceramic masses for union

Bismuth oxide, lead oxide, strontium carbonate, calcium carbonate, and copper oxide were mixed in a prescribed ratio.

The resultant mixture was subjected to a solidphase reacting at 830° C. for 60 hours to form a singlephase superconductive ceramic mass. This mass was pulverized. In a hot press, the resultant grains were subjected to compression molding and sintering under the conditions of 830° C. and 300 kg/cm$^2$ for two hours. The sintered mass had a composition of the formula, $Bi_{1.6}Pb_{0.4}Sr_{1.6}Ca_{2.0}Cu_{2.8}O_{1.6}$, and a critical temperature of 110° K. The density of this sintered mass was 6.2 kg/cm$^3$, representing more than 95% of the theoretical density. On analysis by the X-ray diffraction method, the sintered mass was found to be such that the c axis was oriented to the direction of pressure and the a axis and the b axis representing the directions of flow of electric current in superconduction were oriented perpendicularly to the direction of pressure. The degree of orientation was at least 95%. Two sets of test pieces 1, 2 (dimensions: $9 \times 7 \times 7$ mm$^3$) were cut from the high-density sintered block by the use of a cutter by the procedure indicated in the working examples cited hereinbelow. The two test pieces were made to abut each other on their cut surfaces and subjected to anisotropic union under the following conditions. The joint article was heat-treated in the air at 830° C. for 40 hours and tested for critical temperature and critical current density.

EXAMPLE 1

The test pieces 1, 2 were made to abut each other as illustrated in FIG. 1. In the diagram, F stands for the interface of union of the two test pieces. The surface area of the joint was 7 mm$\times$7 mm. The arrow mark denoted by C indicates the direction of the c axis of each test piece.

The test pieces thus joined were heated in the open air at 800° C. and, at the same time, pressed against each other perpendicularly to the interface F of union, namely in the directions indicated by the symbols A and B, with a pressure of 25 kg/cm$^2$ for 30 minutes. As the results of the heat treatment performed under the aforementioned conditions, the joined test pieces showed a critical temperature of 108° K. and a critical current density of 550 A/cm$^2$ at 77 K.

EXAMPLE 2

The test pieces 1, 2 were treated by following the procedure of Example 1, except that the heating temperature was changed to 780° C.

The joined test pieces showed a critical temperature of 108° K. and a critical current density of 500 A/cm$^2$ at 77 K.

EXAMPLE 3

Figure 2:
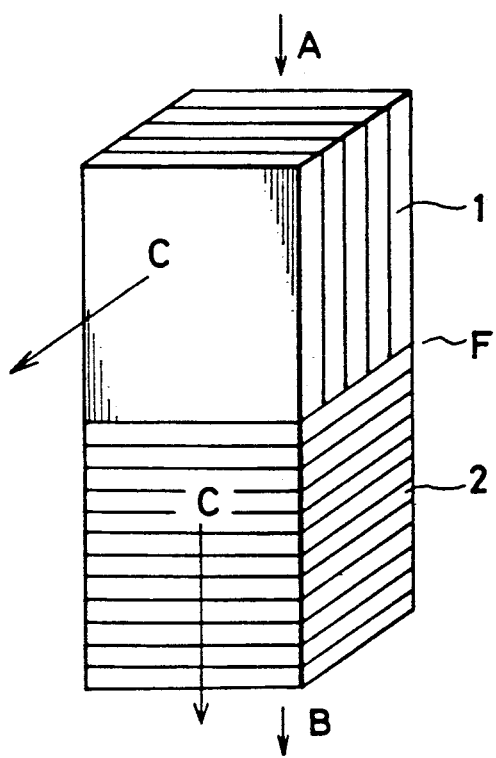

The test pieces 1, 2 were treated by following the procedure of Example 1, except that the c axis of the test pieces 2 was changed as shown in FIG. 2.

The joined test pieces showed a critical temperature of 106° K. and a critical current density of 370 A/cm$^2$ at 77 K.

As described above, the present invention enables two sintered superconductive ceramic masses to be joined without any sacrifice of such superconductive properties as critical temperature, in such a manner that the directions of grain-orientation differentiated across the interface of union. Use of such superconductive ceramic members, therefore, permits production of various superconductive devices as in the field of electronics. Thus, the present invention has a very high economic utility.

EXAMPLE 4

A joint sintered article was produced by faithfully following the procedure of Example 1, except that a sintered ceramic mass of a composition of $Bi_{1.8}Pb_{0.2}Sr_{1.8}Ca_{2.0}Cu_{3.0}O_{10.5}$ was used as test piece 2. The joined test pieces showed a critical temperature of 107° K. and a critical current density of 520 A/cm$^2$ at 77° K.

What is claimed is:

1. A joint sintered high-temperature superconductive ceramic article comprising:
   a first sintered mass of a high-temperature superconductive ceramic substance formed of crystal grains oriented in a first direction and having a composition of $Bi_{2-v}Pb_vSr_wCa_xCu_yO_z$ wherein $0.25 \leq v \leq 0.50$, $1.40 \leq w \leq 2.20$, $1.60 \leq x \leq 2.40$, $2.80 \leq y \leq 3.50$, and $9.00 \leq z \leq 11.00$; and
   a second sintered mass of high-temperature superconductive ceramic substance formed of crystal grains oriented in a second direction and having a composition of $Bi_{2-v}Pb_vSr_wCa_xCu_yO_z$ wherein $0.25 \leq v \leq 0.50$, $1.40 \leq w \leq 2.20$, $1.60 \leq x \leq 2.40$, $2.80 \leq y \leq 3.50$, and $9.00 \leq z \leq 11.00$;
   which are brought into face-to-face contact with each other so that said first and second directions of orientation differ across the interface of contact, pressed against each other in the longitudinal direction relative to the interface of contact under pressure in the range of 10 to 100 kg/cm$^2$, and heated at a temperature in the range of 600° to 950° C.

2. A joint sintered high-temperature superconductive ceramic article according to claim 1, wherein at least one of said values v, w, x, y and z of said first sintered mass differs from said value of said second sintered mass.

3. A joint sintered high-temperature superconductive ceramic article according to claim 1, wherein the interface of contact between said first and second sintered masses has a surface roughness of 1 $\mu$m at most.

4. A joint sintered high-temperature superconductive ceramic article according to claim 1, wherein said sintered high-temperature superconductive ceramic masses for union into said joint sintered article posses one and the same composition.

* * * * *